United States Patent
Chang et al.

(10) Patent No.: US 7,183,809 B2
(45) Date of Patent: Feb. 27, 2007

(54) CURRENT MODE TRANSMITTER CAPABLE OF CANCELING CHANNEL CHARGE ERROR

(75) Inventors: Il-kwon Chang, Gimpo-si (KR); Yong-weon Jeon, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 206 days.

(21) Appl. No.: 11/047,763

(22) Filed: Feb. 2, 2005

(65) Prior Publication Data

US 2005/0174147 A1 Aug. 11, 2005

(30) Foreign Application Priority Data

Feb. 6, 2004 (KR) .................. 10-2004-0007829

(51) Int. Cl.
*H03K 19/094* (2006.01)
(52) U.S. Cl. .................. 326/115; 326/127; 375/295
(58) Field of Classification Search ............ 326/115, 326/127
See application file for complete search history.

(56) References Cited

U.S. PATENT DOCUMENTS

| | | | | |
|---|---|---|---|---|
| 5,504,782 | A * | 4/1996 | Campbell, Jr. .......... | 375/259 |
| 5,832,370 | A | 11/1998 | Pena-Finol et al. ......... | 455/73 |
| 6,169,445 | B1 * | 1/2001 | Tanase .................. | 327/538 |
| 6,320,417 | B1 | 11/2001 | Kirsch et al. ............. | 326/86 |
| 6,348,817 | B2 * | 2/2002 | Lu et al. ................. | 327/108 |
| 6,586,995 | B1 * | 7/2003 | Tachibana ............... | 330/253 |
| 7,075,360 | B1 * | 7/2006 | Holloway et al. .......... | 327/543 |
| 2002/0097789 | A1 | 7/2002 | Muth | |
| 2003/0067325 | A1 | 4/2003 | Haycock et al. ........... | 326/82 |
| 2005/0213672 | A1 * | 9/2005 | Lin et al. ................ | 375/257 |

FOREIGN PATENT DOCUMENTS

JP 2002-271347 9/2002

* cited by examiner

*Primary Examiner*—Vibol Tan
(74) *Attorney, Agent, or Firm*—Lee & Morse, P.C.

(57) ABSTRACT

A current mode transmitter includes a first sink current path, through which a current flows from an output port according to a first bias voltage, a charge error canceller, which supplies a current from a high power supply voltage to a current control port in response to an input signal and counteracts a variation of a second bias voltage in response to an inverted input signal, which has an opposite polarity to that of the input signal, and the second bias voltage, and a second sink current path, which sinks current supplied from the output port in response to the second bias voltage and the inverted input signal, the second sink current path being controlled by the current control port. The input signal and the inverted input signal are complementary.

8 Claims, 4 Drawing Sheets

CURRENT MODE TRANSMITTER CAPABLE OF CANCELING CHANNEL CHARGE ERROR

BACKGROUND OF THE INVENTION

1. Field of the Invention

The present invention relates to data communications. More particularly, the present invention relates to data communications using current signals.

2. Description of the Related Art

FIG. 1 is a circuit diagram of a conventional current mode transmitter.

Referring to FIG. 1, the current mode transmitter determines a logic state of an output signal Iout according to the voltage of the output signal Iout, which varies between a high power supply voltage Vcc and a low power supply voltage GND. To embody the current mode transmitter, a circuit for generating two bias voltages Pbias and Nbias is additionally required to supply the voltages to the current mode transmitter. Thus, the structure of the current mode transmitter is complicated, and power dissipation is increased, since current is continuously supplied from the high power supply voltage Vcc, is sunk to the low power supply voltage GND or sinks irrespective of a state of the output signal Iout.

FIG. 2 is a circuit diagram of another conventional current mode transmitter.

Referring to FIG. 2, the current mode transmitter has an open drain structure in which the drain of a metal oxide silicon (MOS) transistor is open, and an output signal Iout depends on the amount of sink current supplied from an output port. The transmitter shown in FIG. 2 has been proposed to reduce power dissipation as compared with the transmitter shown in FIG. 1.

When current flowing through a MOS transistor M3 is cut off by an inverted input signal Vinb, the current flowing through a MOS transistor M2 is cut off. Thus, only a current of Iref−ΔI flowing through a MOS transistor M1 is supplied from the output port. On the other hand, when current flows through the MOS transistor M3 by the inverted input signal Vinb, a current of 2ΔI flows through the MOS transistor M2. Thus, a current of Iref+ΔI is supplied from the output port. For example, to determine a logic state of an output signal Iout according to the amount of current supplied from the output port, when current supplied from the output port is Iref−ΔI, Iout can be defined as a logic high, and when the current from the output port is Iref+ΔI, Iout can be defined as a logic low.

In the transmitter shown in FIG. 2, since only one bias voltage Bias is used, a circuit for generating the bias voltage Bias is simpler than in the transmitter of FIG. 1 using two bias voltages Pbias and Nbias. Also, as only one power supply voltage GND is used in the transmitter of FIG. 2, power dissipation can be reduced.

In FIG. 2, the MOS transistor M2 operates in a saturation region or a cut-off region according to the voltage of the inverted input signal Vinb. While the operating region of the MOS transistor M2 switches between the saturation region and the cut-off region, channel charges are generated or disappear to vary a voltage drop in a parasitic capacitor Cgs that exists between the gate and the source of the MOS transistor M2. The variation of the voltage drop in the parasitic capacitor Cgs changes the amount of the current flowing through the MOS transistor M2 and finally causes transmission errors. The parasitic capacitor Cgs is generated when a MOS transistor is produced, and the capacitance of the parasitic capacitor Cgs depends on the width and the length of the gate of the MOS transistor.

FIG. 3 is a waveform diagram illustrating the output current of the conventional transmitter shown in FIG. 2.

In the conventional transmitter, two output current states, Iref+ΔI and Iref−ΔI, are generated according to the voltage of the inverted input signal Vinb. The operating region of each MOS transistor included in the current mode transmitter alternately switches between the saturation region and the cut-off region, thereby exhibiting the two output current states Iref+ΔI and Iref−ΔI.

Referring to FIG. 3, while each MOS transistor is alternately switching between the two operation regions, the rising and falling edges of the output current Iout collapse due to the variation in channel charges of the MOS transistor. This collapse phenomenon shows that the waveform of the output current is not the same as that of an input voltage.

Referring to FIGS. 2 and 3, when the inverted input signal Vinb switches from a high state to a low state, a rise in the voltage of the node X lags, thus resulting in a cut-off delay of the MOS transistor M2. The cut-off delay results in a delay in switching of the output current. As a result, a duty ratio of a current signal to be transmitted is deteriorated.

SUMMARY OF THE INVENTION

The present invention is therefore directed to a current mode transmitter including a charge error canceller, which substantially overcomes one or more of the problems due to the limitations and disadvantages of the related art.

It is a feature of an embodiment of the present invention to counteract and cancel transmission current errors caused by a change in channel charges, which occurs while a transistor switches between operation regions.

It is another feature of an embodiment of the present invention to improve cut-off delay is improved, thus enabling rapid and correct current transmissions.

It is yet another feature of an embodiment of the present invention to provide an additional circuit added to a conventional transmitter for improving performance thereof that is structurally simple and requires negligible additional area in the circuit layout.

At least one of the above and other features and advantages of an embodiment of the present invention may be realized by providing a current mode transmitter including a first sink current path, through which a certain current flows from an output port according to a first bias voltage, a charge error canceller, which supplies a current from a high power supply voltage to a current control port in response to an input signal and counteracts a variation of a second bias voltage in response to an inverted input signal, having a phase opposite to that of the input signal, and the second bias voltage, and a second sink current path, which sinks current supplied from the output port in response to the second bias voltage and the inverted input signal, the second sink current path in which the sunk current is controlled by the current control port. Herein, the input signal and the inverted input signal are two phase signals, of which logic high states or logic low states do not overlap each other according to the types of transistors operated by the input signal and the inverted input signal.

The second sink current path may include a first MOS transistor, which has a first port connected to the output port, a second port connected to the current control port, and a gate to which the second bias voltage is applied, and a second MOS transistor, which has a first port that is commonly connected to the second port of the first MOS transistor and the current control terminal, a second port connected to a low power supply voltage, and a gate to which the inverted input signal is applied.

The charge error canceller may include a current gradient improving circuit, which changes a current gradient of a node connected to the first and second MOS transistors, and a charge counteracter, which counteracts charge errors at the node connected to the first and second MOS transistors.

The current gradient improving circuit may include a third MOS transistor, which has a first port connected to the high power supply voltage, a second port connected to the current control port, and a gate to which the input signal is applied.

The charge counteracter may include a fourth MOS transistor, which has a drain and a source connected to each other, and a gate to which the second bias voltage is applied, a fifth MOS transistor, which has a first port connected to the high power supply voltage, a second port that is connected to the drain or source of the fourth MOS transistor, and a gate to which the inverted input signal is applied, and a sixth MOS transistor, which has a first port that is commonly connected to the drain or source of the fourth MOS transistor and the second port of the fifth MOS transistor, a second port connected to the low power supply voltage, and a gate to which the input signal is applied.

BRIEF DESCRIPTION OF THE DRAWINGS

The above and other features and advantages of the present invention will become more apparent to those of ordinary skill in the art by describing in detail exemplary embodiments thereof with reference to the attached drawings in which.

DETAILED DESCRIPTION OF THE INVENTION

Figure 1:
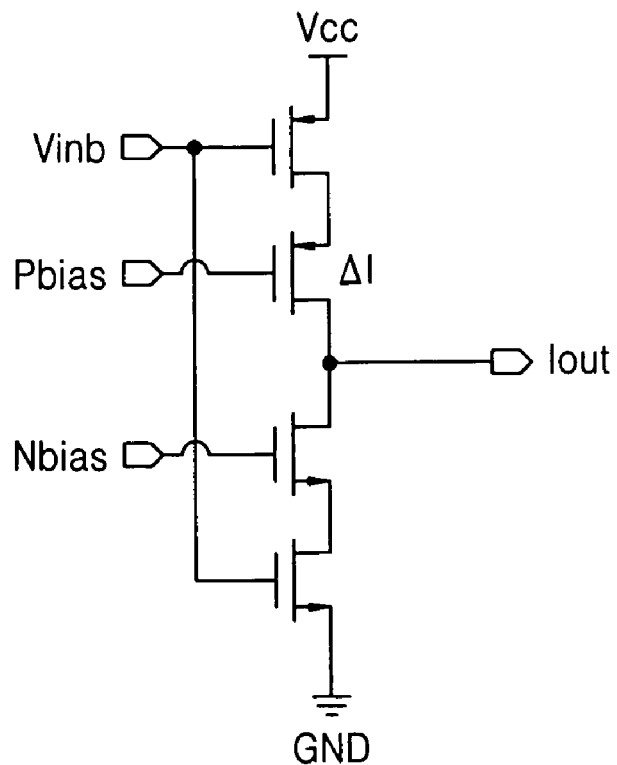
FIG. 1 is a circuit diagram of a conventional current mode transmitter.
Figure 2:
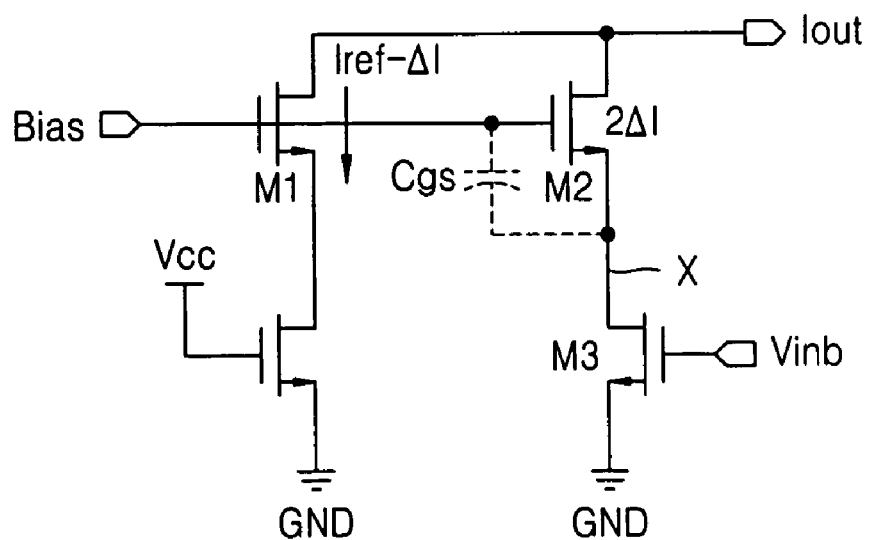
FIG. 2 is a circuit diagram of another conventional current mode transmitter.
Figure 3:
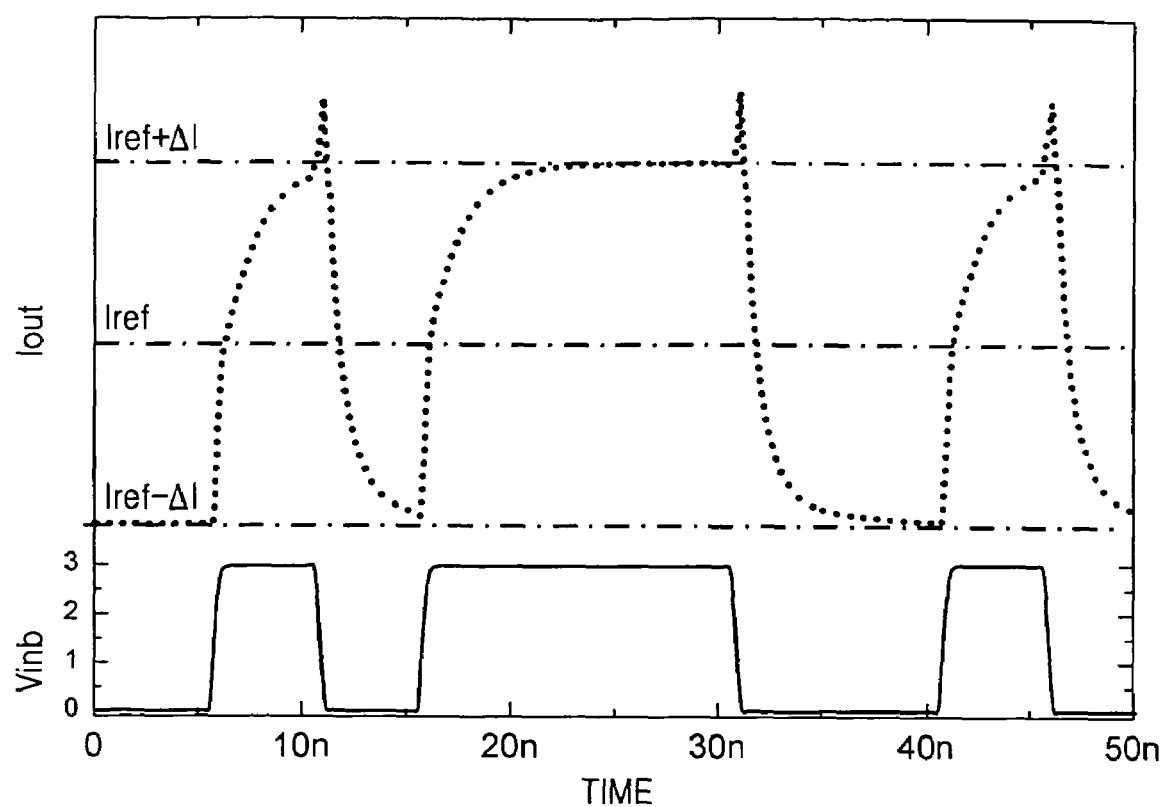
FIG. 3 is a waveform diagram illustrating the output current of the conventional transmitter shown in FIG. 2.

Korean Patent Application No. 2004-07829, filed on Feb. 6, 2004, in the Korean Intellectual Property Office, entitled: "Current Mode Transmitter Capable of Canceling Channel Charge Error," is incorporated by reference herein in its entirety.

The present invention will now be described more fully with reference to the accompanying drawings, in which exemplary embodiments of the invention are shown. The invention may, however, be embodied in different forms and should not be construed as limited to the embodiments set forth herein. Rather, these embodiments are provided so that this disclosure will be thorough and complete, and will fully convey the scope of the invention to those skilled in the art. The same reference numerals are used to denote the same elements throughout the drawings.

Figure 4:
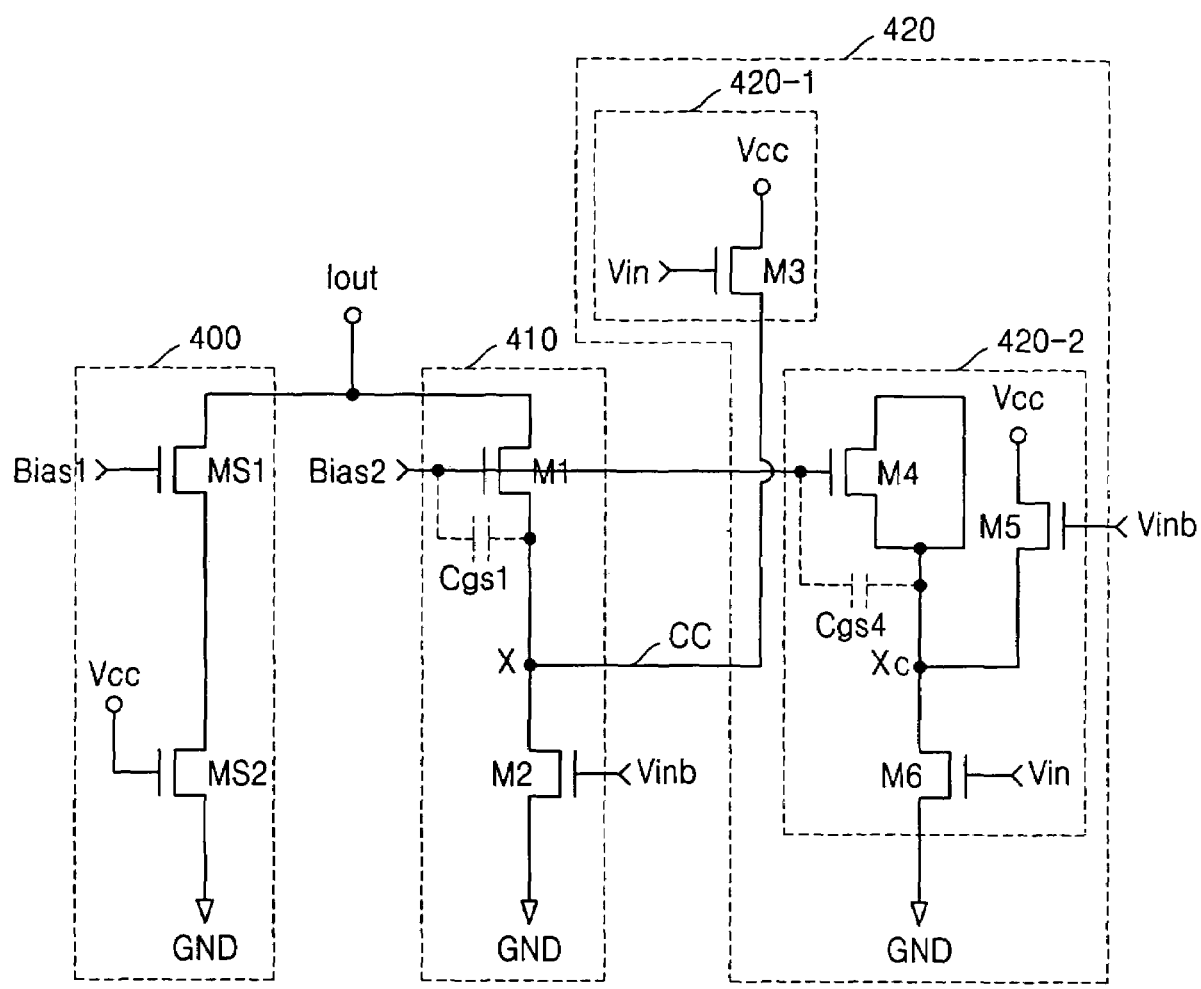
FIG. 4 is a circuit diagram of a current mode transmitter according to the present invention.

FIG. 4 is a circuit diagram of a current mode transmitter according to the present invention.

Referring to FIG. 4, the current mode transmitter includes a first sink current path 400, a second sink current path 410, and a charge error canceller 420.

The first sink current path 400 includes two MOS transistors MS1 and MS2, each of which allows a current of Iref−$\Delta$I, determined by a first bias voltage Bias1, to flow. The first sink current path 400 includes a high power supply voltage Vcc and a low power supply voltage GND. Since the MOS transistors MS1 and MS2 of the first sink current path 400 are identical to those of a conventional circuit, a description thereof will not be repeated here.

The second sink current path 410 includes first and second MOS transistors M1 and M2, each of which allows a current of 2$\Delta$I to flow. One port of the first MOS transistor M1 is connected to an output port, the other port thereof is connected to a node X, and a second bias voltage Bias2 is applied to the gate of the first MOS transistor M1. One port of the second MOS transistor M2 is connected to the node X, the other port thereof is connected to a low power supply voltage GND, and an inverted input signal Vinb is applied to the gate of the second MOS transistor M2.

The charge error canceller 420 includes a current gradient improving circuit 420-1, which rapidly improves the current gradient of the node X, and a charge counteracter 420-2, which counteracts charge errors.

The current gradient improving circuit 420-1 includes a third MOS transistor M3. One port of the third MOS transistor M3 is connected to the high power supply voltage Vcc, the other port thereof is connected to a current counteracting port CC, and an input signal Vin is applied to the gate of the third MOS transistor M3.

The charge counteracter 420-2 includes fourth through sixth MOS transistors M4 through M6. The drain and source of the fourth MOS transistor M4 are combined with each other and connected to a node Xc, and the second bias voltage Bias2 is applied to the gate thereof. One port of the fifth MOS transistor M5 is connected to the high power supply voltage Vcc, the other port thereof is connected to the node Xc, and the inverted input signal Vinb is applied to the gate of the fifth MOS transistor M5. One port of the sixth MOS transistor M6 is connected to the node Xc, the other port thereof is connected to the low power supply voltage GND, and the input signal Vin is applied to the gate of the sixth MOS transistor M6.

In the present invention, current gradient at the node X is rapidly improved, and errors caused by a parasitic capacitor Cgs1 that exists between the node X and the second bias voltage Bias2 are counteracted.

Hereinafter, a method of rapidly improving current gradient will be described.

In the following example, all MOS transistors shown in FIG. 4 are assumed to be NMOS transistors.

When the inverted input signal Vinb applied to the gate of the second MOS transistor M2 switches from a logic high state to a logic low state, the second MOS transistor M2 is turned off, and, thus, current is cut off. At the same time, the third MOS transistor M3, which receives the input signal Vin at its gate, is turned on, and supplies charges to the node X. Since the charges supplied by the third MOS transistor M3 raise the voltage of the node X, a voltage between the gate and the source of the first MOS transistor M1 is remarkably reduced. In this process, the first MOS transistor M1 is turned off in a much shorter time than in the conventional circuit. Also, since the voltage of the node X is increased to Vcc−Vth when the inverted input signal Vinb switches to a logic high state again and the second MOS transistor M2 is turned on, time to drop the voltage of the node X to the low power supply voltage GND can be reduced. Here, Vth is a threshold voltage of a MOS transistor.

Hereinafter, a charge counteracter will be described.

The structure of the fourth MOS transistor M4, in which the drain and the source are combined, corresponds to a capacitor Cgs4 having a surface area that is equal to the area of a channel of the fourth MOS transistor M4. In this case, one electrode of the capacitor Cgs4 corresponds to the second bias voltage Bias2, and the other electrode thereof corresponds to the drain (or source).

As the operating region of the first MOS transistor M1 switches between the saturation region and the cut-off region, charges in the channel of the first MOS transistor M1 are supplied to the source or drain thereof. It is assumed that the supplied charges vary to a certain amount $\Delta V$ a voltage drop in the parasitic capacitor Cgs1 that exists between the gate and source of the first MOS transistor M1. As long as the transmitter operates, the fourth MOS transistor M4 is always turned on and behaves in a linear fashion, and if the input signal Vin is in a logic high state, the sixth MOS transistor M6 is also turned on. The charges in the source (or drain) of the turned-on fourth MOS transistor M4 are supplied to the channel thereof according to the operation of the sixth MOS transistor M6, and vary a voltage drop in the parasitic capacitor Cgs4 between the gate and the source of the fourth MOS transistor M4.

The first MOS transistor M1 and the second MOS transistor M2, which constitute the second sink current path 410, and the third MOS transistor M3, which constitutes the current gradient improving circuit 420-1, are structurally symmetric with respect to the fourth through sixth MOS transistors M4 through M6, which constitute the charge canceller 420-2. Since the phase of the inverted input signal Vinb applied to the gate of the second MOS transistor M2 is opposite to that of the input signal Vin applied to the gate of the sixth MOS transistor M6, when one of the second and sixth MOS transistors M2 and M6 is turned on, the other thereof is turned off. Thus, charges that affect the voltage of the node X have operating characteristics opposite to charges that affect the voltage of the node Xc.

The voltage of the node X that is changed by the parasitic capacitor Cgs1 that exists in the second MOS transistor M2 is defined as $\Delta V$. Here, if the voltage of the node Xc that is changed by the capacitor Cgs4 produced by the fourth MOS transistor M4 is controlled to be $-\Delta V$, i.e., a value having the same absolute value as $\Delta V$ and an opposite polarity to $\Delta V$, voltage variations at the node X and the node Xc can counteract each other. As a result, variations of the second bias voltage Bias2 of the two capacitors Cgs1 and Cgs4, which are caused by charge movements, counteract each other.

The capacitance of each of the capacitors Cgs1 and Cgs4 is limited by manufacturing processes and the area of the channel, and can be controlled by a designer in accordance with desired performance.

As described above, the input signal Vin and the inverted input signal Vinb are complementary, i.e., there logic high states or logic low states do not overlap according to the types of transistors operated thereby.

Figure 5:
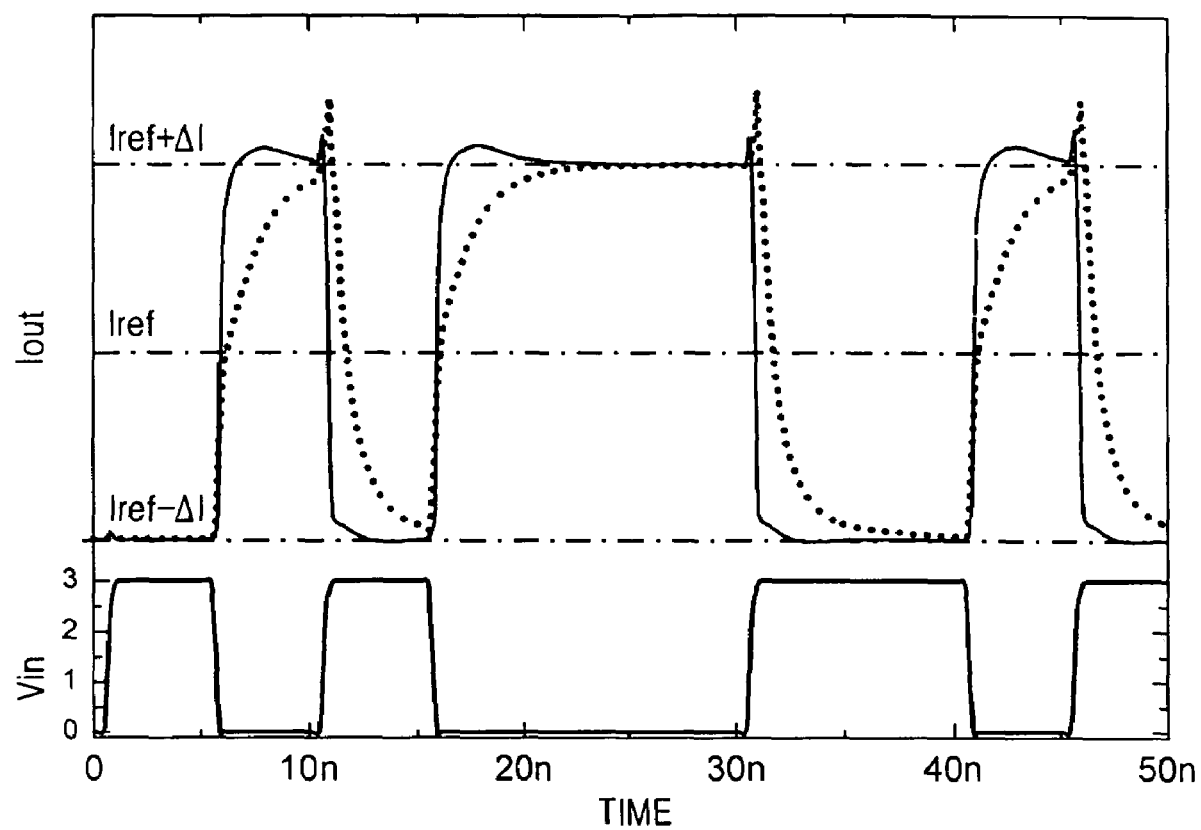
FIG. 5 is a graph showing a comparison between waveforms of the output current signals of a conventional transmitter and a transmitter according to the present invention, further with respect to the input voltage signal.

FIG. 5 is a graph showing a comparison between waveforms of the output signals Iout of a conventional transmitter and a transmitter according to the present invention, as well as a comparison between these current waveforms and a waveform of the input signal Vin.

Referring to FIG. 5, the output characteristic of the transmitter of the present invention, as illustrated by a solid line, is remarkably improved compared with the output characteristic of the conventional transmitter, as illustrated by a dotted line. As can be seen therein, the switching between regions in the output current waveform of the present invention is much faster than that of the conventional current waveform. In other words, the output current waveform of the present invention much more closely approximates the shape of the input voltage waveform. Although FIG. 5 shows data obtained by a computer simulation, it is obvious that the same result can be obtained when semiconductor chips are practically manufactured and tested.

As described above, in the current mode transmitter according to the present invention, when current supplied from an output port sinks, current transmission errors caused by charges can be prevented. Also, cut-off delay is improved, thus enabling rapid and correct current transmissions. Further, since a circuit that is added to a conventional transmitter in order to embody the present invention is structurally simple, the additional area in the circuit layout is negligible.

Exemplary embodiments of the present invention have been disclosed herein, and although specific terms are employed, they are used and are to be interpreted in a generic and descriptive sense only and not for purpose of limitation. Accordingly, it will be understood by those of ordinary skill in the art that various changes in form and details may be made without departing from the spirit and scope of the present invention as set forth in the following claims.

What is claimed is:

1. A current mode transmitter, comprising:
   a first sink current path, through which a current flows from an output port in accordance with a first bias voltage;
   a charge error canceller, which supplies a current from a high power supply voltage to a current control port in response to an input signal, and counteracts a variation of a second bias voltage in response to an inverted input signal, which has an opposite phase to that of the input signal, and the second bias voltage; and
   a second sink current path, which sinks current supplied from the output port in response to the second bias voltage and the inverted input signal, the second sink current path being controlled by the current control port,
   wherein the input signal and the inverted input signal are complementary.

2. The current mode transmitter as claimed in claim 1, wherein the second sink current path comprises:
   a first MOS transistor, which has a first port connected to the output port, a second port connected to the current control port, and a gate to which the second bias voltage is applied; and
   a second MOS transistor, which has a first port that is commonly connected to the second port of the first MOS transistor and the current control terminal, a second port connected to a low power supply voltage, and a gate to which the inverted input signal is applied.

3. The current mode transmitter as claimed in claim 2, wherein the charge error canceller comprises:
   a current gradient improving circuit, which changes a current gradient of a node connected to the first and second MOS transistors; and
   a charge counteracter, which counteracts charge errors at the node connected to the first and second MOS transistors.

4. The current mode transmitter as claimed in claim 3, wherein the current gradient improving circuit comprises a third MOS transistor, which has a first port connected to the high power supply voltage, a second port connected to the current control port, and a gate to which the input signal is applied.

5. The current mode transmitter as claimed in claim 3, wherein the charge counteracter comprises:
   a fourth MOS transistor, which has a drain and a source connected to each other, and a gate to which the second bias voltage is applied;
   a fifth MOS transistor, which has a first port connected to the high power supply voltage, a second port that is connected to the drain and source of the fourth MOS transistor, and a gate to which the inverted input signal is applied; and
   a sixth MOS transistor, which has a first port that is commonly connected to the drain and source of the fourth MOS transistor and the second port of the fifth MOS transistor, a second port connected to the low power supply voltage, and a gate to which the input signal is applied.

6. The current mode transmitter as claimed in claim 5, wherein the current gradient improving circuit comprises a third MOS transistor, which has a first port connected to the high power supply voltage, a second port connected to the current control port, and a gate to which the input signal is applied.

7. A current mode transmitter, comprising:
   a first sink current path, through which a current flows from an output port in accordance with a first bias voltage;
   a second sink current path, which sinks current supplied from the output port in response to a second bias voltage and an inverted input signal, which has an opposite phase to that of an input signal; and
   means for canceling charge error, including
      means for controlling the second sink current path in accordance with the input signal, and
      means for counteracting a variation of the second bias voltage in accordance with the inverted input signal,
   wherein the input signal and the inverted input signal are complementary.

8. The current mode transmitter as claimed in claim 7, wherein the means for canceling charge error comprises:
   first and second transistors connected in series;
   means for changing a current gradient of a node connected to the first and second transistors; and
   means for counteracting charge errors at the node connected to the first and second MOS transistors.

* * * * *